United States Patent
Arya et al.

[11] Patent Number: 5,833,888
[45] Date of Patent: Nov. 10, 1998

[54] WEEPING WEIR GAS/LIQUID INTERFACE STRUCTURE

[75] Inventors: Prakash V. Arya, New York, N.Y.; Mark Holst, Concord, Calif.; Kent Carpenter, Stamford, Conn.; Scott Lane, Chandler, Ariz.

[73] Assignee: ATMI Ecosys Corporation, San Jose, Calif.

[21] Appl. No.: 778,396

[22] Filed: Dec. 31, 1996

[51] Int. Cl.⁶ .................................................. B01F 3/04
[52] U.S. Cl. ........................................ 261/112.1; 261/104
[58] Field of Search .............................. 261/112.1, 104; 55/241

[56] References Cited

U.S. PATENT DOCUMENTS

| | | | |
|---|---|---|---|
| 2,530,716 | 11/1950 | Meynier | 261/99 |
| 2,545,028 | 3/1951 | Haldeman | 261/112.1 |
| 2,551,114 | 5/1951 | Goddard | 261/99 |
| 2,580,013 | 12/1951 | Gazda | 261/99 |
| 2,873,818 | 2/1959 | Veres | 261/99 |
| 3,871,305 | 3/1975 | Watanabe et al. | 55/241 |
| 3,888,955 | 6/1975 | Maruko | 261/104 |
| 3,918,917 | 11/1975 | Ashina et al. | 261/112.1 |
| 4,054,424 | 10/1977 | Staudinger et al. | 55/261 |
| 4,068,625 | 1/1978 | Brown | 261/104 |
| 4,083,607 | 4/1978 | Mott | 55/DIG. 32 |
| 4,116,491 | 9/1978 | Ply | 406/89 |
| 4,172,708 | 10/1979 | Wu et al. | 55/261 |
| 4,479,809 | 10/1984 | Johnson et al. | 55/261 |
| 4,874,559 | 10/1989 | Brun | 261/112.1 |
| 4,902,303 | 2/1990 | Bleyker | 261/112.1 |
| 4,986,838 | 1/1991 | Johnsgard . | |
| 5,113,789 | 5/1992 | Kamian . | |
| 5,118,286 | 6/1992 | Sarin . | |
| 5,252,007 | 10/1993 | Klinzing et al. | 406/193 |
| 5,575,636 | 11/1996 | Kobayashi et al. . | |

FOREIGN PATENT DOCUMENTS

| | | | |
|---|---|---|---|
| 92155 | 1/1962 | Denmark | 406/89 |
| 578373 | 6/1933 | Germany | 406/193 |
| 2140520 | 2/1972 | Germany | 406/89 |
| 42 11 138A | 10/1993 | Germany | 406/47 |
| 541748 | 3/1977 | U.S.S.R. | 406/89 |
| 650128 | 2/1951 | United Kingdom | 406/48 |
| 680460 | 10/1952 | United Kingdom | 406/89 |
| 2 258 203 | 2/1993 | United Kingdom | 406/89 |
| WO 95/00425 | 1/1995 | WIPO | 406/47 |

OTHER PUBLICATIONS

Abrea, et al., Causes of anomalous solid formation in the exhaust system of low-pressure chemical vapor deposition plasma enhanced chemical vapor deposition semiconductor processes, J. Vac. Sci. Technol B 12(4) Jul./Aug. 1994, pp. 2763–2767.

*Primary Examiner*—Tim R. Miles
*Attorney, Agent, or Firm*—Steven J. Hultquist; Oliver A. Zitzmann

[57] ABSTRACT

A gas/liquid interface structure for transport of a gas stream from an upstream source of same to a downstream processing unit, comprising first and second flow passage members defining an annular volume therebetween, with the second flow passage member extending downwardly to a lower elevation than the lower end of the first flow passage member, with an outer wall member enclosingly circumscribing the second flow passage member and defining therewith an enclosed interior annular volume, and with a liquid flow port in the outer wall member for introducing liquid into the enclosed interior annular volume. The second flow passage member includes an upper liquid-permeable portion in liquid flow communication with the enclosed interior annular volume, whereby liquid from such volume can "weep" through the permeable portion and form a falling liquid film on interior surface portions of the second flow passage member, as a protective liquid interface for the second flow passage member.

19 Claims, 2 Drawing Sheets

WEEPING WEIR GAS/LIQUID INTERFACE STRUCTURE

BACKGROUND OF THE INVENTION

1. Field of the Invention

This invention relates to a weeping weir gas/liquid interface structure which is usefully employed for introduction of particulate solids-containing fluid streams, from an upstream process generating same, to a downstream fluid processing system.

1. Description of the Related Art

In the processing of particulate solids-containing fluid streams for treatment thereof, clogging of inlet structures of process equipment with particulate solids from such streams is frequently a problem. As the particulate solids-containing stream is flowed through the process equipment, the solids may be deposited on the surfaces and in the passages of the inlet structure.

If the particulate solids accumulate with continued operation of the process equipment, the inlet structure of such equipment may become occluded to sufficient extent as to plug entirely, or alternatively the solids build-up may not occlude the inlet of the process unit, but may so impair the flows and increase the pressure drop in the system as to render the process equipment grossly inefficient for its intended purpose.

In the case of operations such as treatment of effluent gases from semiconductor manufacturing operations, the waste gas may be subjected to oxidation treatment, to oxidatively abate hazardous oxidizable components of the effluent gas, by means of thermal oxidation, or other oxidation reaction processes. By such oxidation, it is possible to significantly reduce pyrophoric components and toxic components in the effluent stream, as well as to oxidatively remove other components which may be deleterious in release to the atmosphere from the process facility.

The effluent gases subjected to such treatment may contain not only significant fine particles content, e.g., submicron particles of silica, metals from CVD or other deposition operations, etc., but such gas streams may contain significant gaseous components which may be corrosive in the treatment environment, at the elevated temperatures typically employed for oxidation treatment. Such corrosive character thus poses a problem in respect of the hot effluent gas stream from the oxidation treatment, as well as the solids accumulation capability attributable to the particulates content of such effluent gas stream.

The particulate solids in such gas streams may clog downstream processing equipment, e.g., downstream processing operations including water scrubbing. Clogging of scrubbing equipment is a significant problem in the art. This is particularly the case when there exists a transition from hot oxidizing conditions inherent to a combustion device to the cool wet conditions of a quench chamber. By definition, there exists a transition zone in which the flow transition from hot combustion conditions to wet quenching conditions take place. Associated problems in such oxidation/scrubbing/quench systems include particulate accumulation and eventual cross-section occlusion due to back-diffusion of moisture and spray from the wet quench zone creating a sticky adhering particulate that will accumulate in portions of the quench region immediately above the wetted zone.

Another problem is attributable to the lack of permanent definition of the location of the wet/dry interface. Because the location of the wet/dry interface can change as the fluid dynamics of the system change, it becomes correspondingly very difficult to precisely locate the wet/dry interface. Factors influencing the location of the interface include: (a) combustion off-gas flow rate and thermal duty, (b) quench spray flow rate and overflow weir flow rate, and (c) back mixing and eddying of the quench spray or overflow weir flow. The inability to fix the location of the wet/dry interface results in two difficulties: (1) regions are created which are susceptible to particulate agglomeration, and (2) corrosion of the materials of the quench region may resultingly occur.

Most alloys used for combustion and quenching equipment are corrosion-resistant for a specific set of conditions. Those alloys which will withstand hot oxidizing conditions are typically unsuitable for wet corrosion conditions and vice versa. This problem is further exacerbated when additional products may be present which accelerate corrosion or oxidation, such as the presence of halogens, sulfidizing agents, etc. Since it is impossible to precisely fix the material of construction specification transition, it then becomes necessary to use exotic materials of construction that tend to be excessively costly and to perform at only mediocre level.

Significant effort has been expended to solve such problem. To date no acceptable solutions have been found, and all proposed solutions suffer from a variety of deficiencies. Two approaches are typically used as a matter of necessity. The first is the use of an overflow weir to wet the walls at the transition. The second is the use of a submerged quench. The overflow weir performs the best job in preventing particulate accumulation but suffers from three primary deficiencies. The overflow weir does only a mediocre job of preventing particulate accumulation as it still has a wet/dry interface at the point of water introduction. The overflow weir requires significant levels of water in order to maintain minimum wetting rates of the metal surfaces. Additionally, the overflow weir requires precise leveling in order to maintain a uniform falling film to protect the metal of the quench region.

Of these problems, the most significant is the direct coupling of overflow weir water addition rate to minimum wetting rate and to levelness of the equipment. These factors preclude the minimization of water addition rates to the weir and constitute an unacceptable limitation. It is found in practice that no matter how much effort is put into leveling quench equipment, the inherent thermal stresses involved in combustion/quench processes require a constant re-leveling of the equipment in order to maintain quench levelness within tolerances. This circumstance entails an unacceptable maintenance effort. Discussions of the requirement for minimum wetting rate and for levelness can be found in "Chemical Engineers Handbook," ed.: Perry & Chilton, Fifth Edition, pp. 5–57. See also "Process Heat Transfer," by Hewitt, G. F., et al., CRC Press 1993, pp. 539–541, as well as page 475 of such reference for a depiction of submerged quench.

Accordingly, it would be a significant advance in the field to provide an improved structure for receiving effluent gas streams, such as hot, particulate-laden gas discharged from an oxidation chamber in a semiconductor waste gas treatment system, which is nonsusceptible to solids deposition and clogging, as well as resisting corrosion problems incident to the elevated temperature character of the effluent from the oxidation treatment and the corrosive gas species in such effluent.

It therefore is an object of the present invention to provide an improved gas flow structure for receiving hot, particulate-laden effluent gas streams, which is resistant to solids deposition and clogging, as well as having enhanced resistance to corrosion, with respect to internal surfaces of the structure enclosing the gas flow path.

It is a further object of the invention to provide an improved gas/liquid interface structure characterized by decoupling of overflow weir water addition rate from minimum wetting rate and levelness of the equipment.

Other objects and advantages of the present invention will be more fully apparent from the ensuing disclosure and appended claims.

SUMMARY OF THE INVENTION

In a broad aspect, the present invention relates to a gas flow stream-receiving structure which is resistant to deposition of solids, clogging and corrosion, when a hot, particulate-laden gas stream containing corrosive components is flowed therethrough.

More specifically, the invention relates to a gas/liquid interface structure useful for transport of a hot, particulate solids-containing gas stream from an upstream source of such gas stream to a downstream processing unit.

Such gas/liquid interface structure comprises:

a first vertically extending inlet flow passage member defining a first gas stream flow path therewithin, such inlet flow passage member having an upper inlet for introduction of the gas stream to the gas stream flow path and a lower exit end for discharge of the gas stream therefrom, subsequent to flow of the gas stream through the gas stream flow path within the inlet flow passage member;

a second flow passage member circumscribing the first flow passage member and in outwardly spaced relationship thereto, to define an annular volume therebetween, such second flow passage member extending downwardly to a lower exit end which is below the lower exit end of the first flow passage member, such second flow passage member having an upper liquid-permeable portion and a lower liquid-impermeable portion defining a gas stream flow path of the second flow passage member;

an outer wall member enclosingly circumscribing the second flow passage member and defining therewith an enclosed interior annular volume; and a liquid flow inlet port in such outer wall member for introducing liquid into the enclosed interior annular volume between the outer wall member and the second flow passage member;

whereby liquid introduced via the liquid flow inlet port in the outer wall member enters the enclosed interior annular volume and weepingly flows through the upper liquid-permeable portion of the second flow passage member, for subsequent flow down interior surfaces of the liquid-impermeable portion of the second flow passage member, to provide a downwardly flowing liquid film on such interior surfaces of the liquid-impermeable portion of the second flow passage member, to resist deposition and accumulation of particulate solids thereon, and with the gas stream flowed through the first flow passage member being discharged at the lower exit end thereof, for flow through the flow path of the second flow passage member, and subsequent discharge from the gas/liquid interface structure.

By such arrangement, the gas stream is prevented from directly contacting the walls in the lower portion of the structure, in which the gas stream flow path is bounded by the interior wall surfaces of the second flow passage member. The failing film of water from the "weeping weir" upper portion of the second flow passage member resists particulate solids accumulating on the wall surfaces of the second flow passage member. The motive liquid stream on such wall surfaces carries the particulates in the gas stream contacting the water film, downwardly for discharge from the gas/liquid interface structure. Additionally, corrosive species in the gas stream are prevented from contacting the wall, which is protected by the falling water film in the lower portion of the interface structure.

In a further specific aspect, the invention is deployed between an upstream oxidizer unit, such as an electrical thermal oxidizer unit, and a downstream water scrubber in which the gas is scrubbed by water to remove the particulate solids therefrom.

The upper liquid permeable portion of the second flow passage member may be of suitable porous construction, and may for example comprise a porous sintered metal, porous plastic, or porous ceramic wall, with pore sizes which may for example be in the range of from about 0.5 micron to about 30 microns, or even larger pore diameters.

Other aspects and features of the present invention will be more fully apparent from the ensuing disclosure and appended claims.

DETAILED DESCRIPTION OF THE INVENTION, AND PREFERRED EMBODIMENT THEREOF

Figure 1:
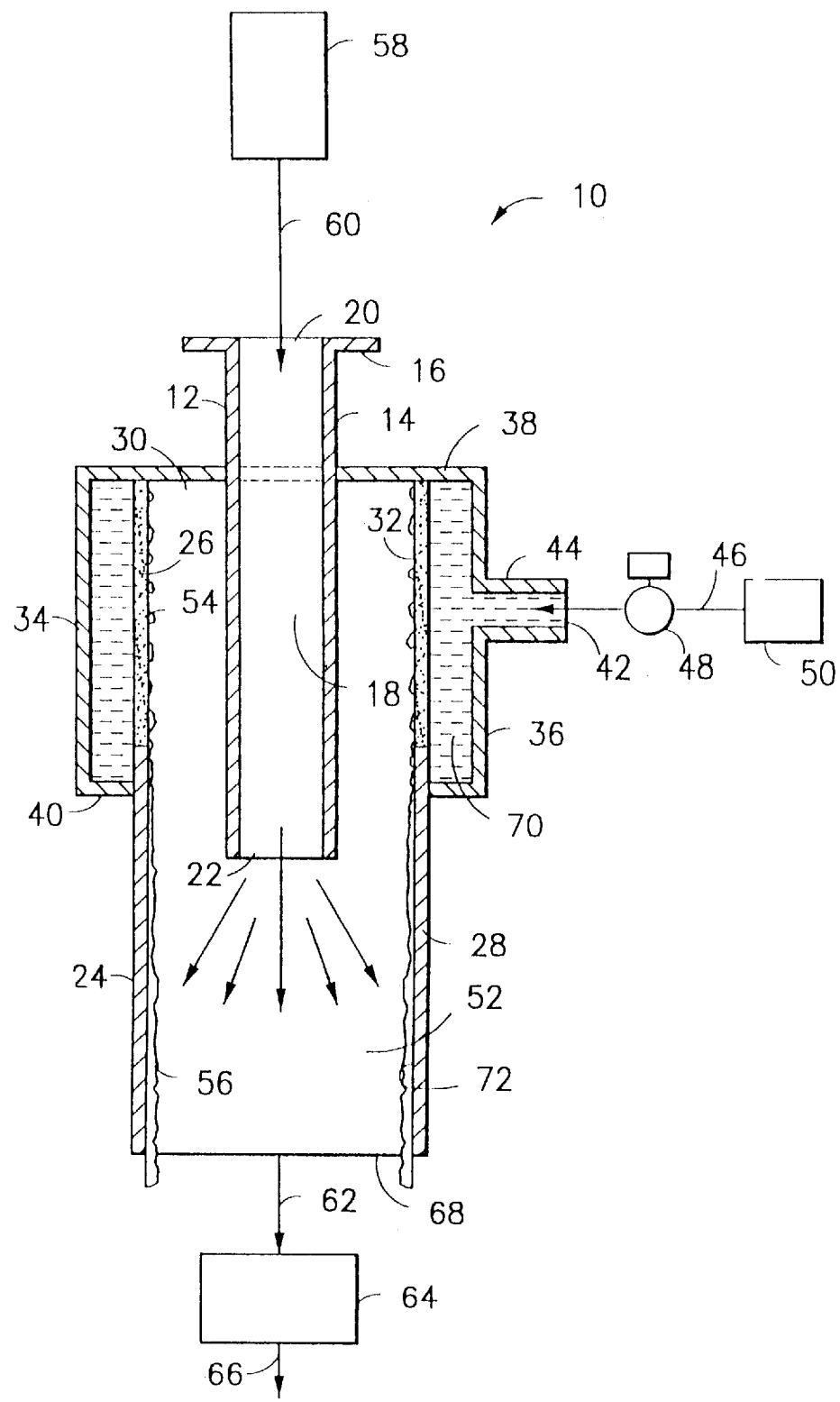
FIG. 1 is a schematic cross-sectional elevation view of a gas/liquid interface structure in accordance with an illustrative embodiment of the invention.

Referring to the drawing, FIG. 1 is a schematic cross-sectional elevation view of a gas/liquid interface structure 10 according to one embodiment of the present invention.

The gas/liquid interface structure 10 includes a first vertically extending inlet flow passage member 12 defined by a cylindrical elongate wall 14. The cylindrical wall 14 circumscribes an enclosed flow passage 18 within the inlet flow passage member 12. At an upper end of cylindrical wall 14 there is provided a radially outwardly extending flange 16 for joining the gas/liquid interface structure to associated process flow piping, conduits, instrumentation, etc.

The first inlet flow passage member 12 thus has an inlet 20 at its upper end, and a corresponding outlet 22 at its lower end, so that the open inlet and outlet ends define with the interior volume a flow path including flow passage 18, through which gas from an upstream process unit 58 may be flowed, as in line 60 illustratively shown in FIG. 1.

The length of the first inlet flow passage member 12 may be significantly shorter than is illustrated in FIG. 1, and the outlet 22 extremity of such flow passage member may terminate just below the top end wall 38 in the interior annular volume 30 of the structure. Alternatively, the outlet 22 extremity of such flow passage member may terminate at a lower vertical point within the second flow passage member 24 than is illustratively shown in FIG. 1.

The vertical downward extent of the first inlet flow passage member 12 may therefore be varied in the practice of the invention, and the specific length and dimensional characteristics may readily be determined without undue experimentation to select a conformation and arrangement which achieves a desired operating character in the specific application of use of the inlet structure of the invention.

The upstream process unit 58 may for example comprise a semiconductor manufacturing tool and associated effluent gas treatment apparatus. Such effluent treatment apparatus may in turn comprise an oxidizer for oxidation of oxidizable components in the effluent gas. Suitable oxidizers are of widely varying type, and may for example be constituted by a thermal oxidation unit, an electrothermal oxidizer, etc.

When the upstream process unit 58 comprises gas generating means and gas treatment means for semiconductor manufacturing operations, the gas stream introduced to inlet 20 of the first inlet flow passage member 12 may be at elevated temperature and may contain substantial concentration of particulate solids. e.g., in the form of sub-micron size particles.

The interface structure 10 further comprises a second flow passage member 24 which circumscribes the first flow passage member 12 and is in spaced relationship thereto, as shown, to define an annular volume 30 therebetween. The second flow passage member 24 extends downwardly to a lower end 68 below the lower end of the first flow passage member 12, so that the open outlet 22 of the first flow passage member is in vertically spaced relationship to the open lower end 68 of the second flow passage member 24. As discussed, the position of the outlet 22 of the first flow passage member may be widely vertically varied in the broad practice of the present invention.

The second flow passage member 24 comprises an upper liquid-permeable portion 26 and a remaining liquid-impermeable portion 28, extending downwardly from the liquid-permeable portion 26, as illustrated. The upper liquid-permeable portion 26 and lower liquid-impermeable portion 28 may be formed in any suitable manner, as for example by joining of an upper porous cylindrical segment 26 to an initially separate lower solid-walled cylindrical segment 28, with the respective portions being joined to one another by brazing, soldering, welding, mechanical fastener securement, or in any other suitable manner with appropriate joining means and method.

Alternatively, the second flow passage member 24 may be formed from a unitary cylindrical tubular member, an upper part of which is rendered liquid-permeable in character by processing, such as water-jet machining, etching, sintering, micro-electromachining, electromachining, or any other suitable technique by which porosity or permeability characteristics can be imparted to the upper portion of such tubular member. Preferably, the second flow passage member is formed of initially separate upper and lower portions which are joined together and wherein the upper portion is constituted by a porous sintered metal material, a porous plastic material, a porous ceramic material, or other porous material, wherein the porosity is of sufficient dimensional character to allow liquid permeation therethrough, as described hereafter in greater detail.

The gas/liquid interface structure 10 further comprises an outer wall member 34 enclosingly circumscribing the second flow passage member and defining therewith an enclosed interior annular volume 70. The outer wall member 34 comprises a cylindrical side wall 36, a top end wall 38 and a bottom end wall 40, which corporately enclose the interior annular volume 70. The side wall 36 is provided with a liquid introduction port 42. The port may be provided in any suitable manner, but in the embodiment shown is constituted by tubular port extension 44. Alternatively, the port may simply be an orifice or opening in the side wall, or other liquid inlet structure, whereby liquid can be introduced into the interior annular volume 70 from an external liquid supply.

In the FIG. 1 embodiment, the liquid inlet port 42 is coupled with liquid introduction line 46 containing flow control valve 48 therein. The liquid inlet line 46 is connected to liquid supply reservoir 50.

Figure 2:
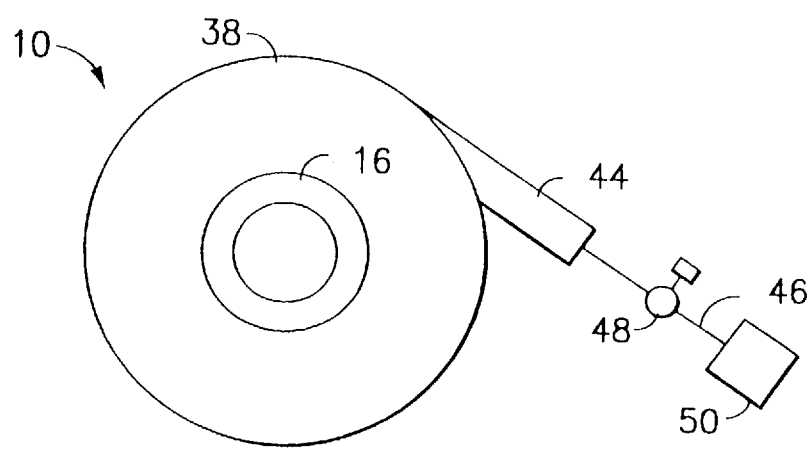
FIG. 2 is a top plan view of the apparatus of FIG. 1, showing a tangential feed arrangement for the liquid passed to the enclosed interior annular volume 70 of the interface structure shown in FIG. 1.

FIG. 2 is a top plan view of the apparatus of FIG. 1, showing the tangential feed arrangement for the liquid passed to the enclosed interior annular volume 70 of the interface structure shown in FIG. 1. FIG. 2 shows the tubular port extension 44 arranged to tangentially intersect and join with the cylindrical side wall of the outer wall member. In such manner the introduced liquid is highly evenly circumferentially distributed around the upper porous cylindrical segment (liquid-permeable upper portion 26), so that the liquid film produced by weepage through the porous cylindrical segment is correspondingly circumferentially uniform to shroud the inner wall surface 72 as hereinafter more fully described.

The liquid flow control valve 48 in line 46 may be coupled to suitable controller/timer means, including a central processing unit (CPU), microprocessor, flow control console, and/or ancillary monitoring and control means, for providing a predetermined or otherwise selected flow of liquid from reservoir 50 through line 46 to liquid inlet port 42. The thus-introduced liquid fills the interior annular volume 70, and such liquid may be introduced at any suitable process conditions.

For processing of gas streams such as hot particulate-laden effluent gas streams from semiconductor manufacturing operations, the liquid in interior annular volume 70 may be water or other aqueous media.

By virtue of the liquid-permeable character of the upper liquid permeable portion 26 of the second flow passage member 24, liquid from interior annular volume 70 permeates through the upper portion 26 of the second flow passage member and is expressed at the inner wall surface 32 of such upper portion as liquid droplets 54.

Such issuing liquid droplets, as a result of gravitational effect, fall and coalesce with other liquid droplets and aggregate to form a downwardly flowing liquid film 56 on the inner wall surface 72 of the lower liquid-impermeable portion of the second flow passage member. The liquid in the liquid film discharging from the lower open end 68 of the second flow passage member may be directed to suitable collection and processing means (not shown), e.g., for co-processing thereof in a downstream process unit 64 to which the gas stream is flowed from gas flow passage 52 of the second flow passage member in line 62.

The downstream process unit 64 may be a water scrubber, reaction chamber, or other processing apparatus or treatment zone, in which the gas stream flowed from passage 52 in line 62 is subjected to further process operations, with discharge of final effluent gas from the downstream process unit in line 66.

The gas/liquid interface structure 10 thus is constructed to provide an interior annular volume 30 between the first and second flow passage members, with an upper liquid-permeable portion 26 of the second flow passage member, so that liquid weeping through the liquid-permeable upper portion can coalesce and develop the falling liquid film 56. By this arrangement, the gas flowed from flow passage 18 to flow passage 52 encounters an interior wall surface 72 of the lower portion of the second flow passage member, which is blanketed with a protective liquid film 56. Accordingly, any corrosive species in the gas discharged from the lower open end 22 of the first flow passage member will be "buffered" in relation to the inner wall surface, to minimize corrosion and adverse reaction effects on such interior wall surface of the second flow passage member.

Further, by introduction of liquid to the interior annular volume 70 between the second flow passage member and the outer wall member 34, there is provided a liquid reservoir "jacket" structure. Liquid thereby is provided to the porous upper portion of the second flow passage member, for permeation therethrough, and downward "weeping" of liquid to form a protective film on the interior wall surface of the second flow passage member.

Such falling film on interior surface 72 of the second flow passage member also serves to entrain and to carry away any particulates from the gas stream which in the absence of such liquid film might deposit on and aggregate on the interior wall surface of the second flow passage member.

Accordingly, the falling liquid film affords a protective function with respect to the interior wall surface of the second flow passage member, as well as provides an entrainment medium which carries away particulate solids and any other gas phase components, which otherwise would be deleterious in accumulation on the interior wall surface of the flow passage member.

As a further advantage of this structure illustratively shown in FIG. 1, the use of an upper liquid permeable portion 26 serves to minimize liquid usage, relative to the provision of a structure such as a liquid overflow weir, in which liquid from the interior annular volume 70 would simply overflow an upper end of wall 26 and flow downwardly in a film on the wall, over the full interior surface length of the second flow passage member. The liquid required for operation is maintained at a very low level by the weeping weir structure of the present invention.

Another advantage of the weeping weir structure of the present invention over simple liquid overflow weir structures is that the latter require precise alignment to vertical in order for the weir to work efficiently as designed, whereas the weeping weir structure is tolerant of deviations from normal (vertical) orientation, without loss or impairment of operational design efficiency.

In other words, the weeping weir structure of the present invention is characterized by decoupling of overflow weir water addition rate from the levelness of the structure, as well as from minimum wetting rate by the liquid permeable weir wall (since there is no threshhold liquid inventory to be established and maintained for initiating liquid issuance from the weir, as in conventional overflow structures).

As an illustrative example of the gas/liquid interface structure of the type illustratively shown in FIG. 1, such structure may be employed downstream of a thermal oxidizer unit processing effluent gases from semiconductor manufacturing operations, so that the gas stream in line 60 entering the interface structure 10 is at elevated temperature and laden with particulates, such as silica, particulate metals, and the like, as sub-micron size particles or even larger solids, as well as corrosive solids.

In such embodiment, the upper portion 26 of the second flow passage member may be constituted by a sintered metal wall having a thickness on the order of $1/16$th inch, with an average pore size of about 2 microns. The length of the first flow passage member 12 may be on the order of 48 inches, with a diameter on the order of 2.5 inches. The corresponding second flow passage member 24 may correspondingly have a length on the order of 13.5 inches, with a diameter on the order of 4.5 inches. The outer wall member 34 may have a vertical length on the order of 5.5 inches, with a diameter on the order of 6 inches.

In such system, water may be employed as the liquid medium from reservoir 50 which is introduced into interior annular volume 70 for weep-through of such liquid onto the interior surface 32 of the upper liquid permeable portion 26 of the second flow passage member. The usage of water in such system may be on the order of 0.1–0.3 gallon per minute of operation.

While the invention has been described with reference to an illustrative embodiment, it will be recognized that other variations, modifications, and other embodiments are contemplated, as being within the spirit and scope of the invention, and therefore the invention is to be correspondingly broadly construed with respect to variations, modifications and other embodiments, within its spirit and scope as hereafter claimed.

What is claimed is:

1. A gas/liquid interface structure for transport of a gas stream from an upstream source of same to a downstream processing unit, said gas/liquid interface structure comprising:

a first vertically extending inlet flow passage member having an upper entrance for introduction of said gas stream and a lower end for discharge of said gas stream;

a second flow passage member circumscribing the first flow passage member and in spaced relationship thereto, to define an annular volume therebetween, said second flow passage member extending downwardly to a lower end below the lower end of the first flow passage member, and said second flow passage member having an upper liquid-permeable portion and a lower liquid-impermeable portion below said upper liquid-permeable portion, the upper liquid-permeable portion of the second flow passage member comprising a porous cylindrical wall that is permeable to flow of liquid therethrough over its entire surface, said porous cylindrical wall comprising an inner wall surface bounding said annular volume, and an opposite outer wall surface;

a liquid reservoir jacket enclosingly surrounding the outer wall surface of the porous cylindrical wall and defining therewith an enclosed interior annular volume for holding pressurized liquid; and means for introducing pressurized liquid into the enclosed interior annular volume of the liquid reservoir jacket, for permeation of the pressurized liquid through the porous cylindrical wall from its outer wall surface to its inner wall surface so that liquid permeated through the porous cylindrical wall is coalesced on the inner wall surface to form a liquid film downwardly flowed over an inner surface of the lower liquid-impermeable portion of the second flow passage member.

2. A gas/liquid interface structure according to claim 1, wherein the lower end of the first vertically extending inlet flow passage member terminates below the elevation of the lower end of the porous cylindrical wall member, so that the gas stream discharged from the lower end of the first vertically extending inlet flow passage member is exposed in subsequent downward flow through the second flow passage member to the lower liquid-impermeable portion having said liquid film downwardly flowed over its inner surface, thereby protecting the lower liquid-impermeable portion of the first vertically extending inlet flow passage member from gas stream contact.

3. A gas/liquid interface structure according to claim 1, wherein the porous cylindrical wall is formed of a material selected from the group consisting of sintered metal materials, porous ceramic materials, and porous plastic materials.

4. A gas/liquid interface structure according to claim 1, wherein the porous cylindrical wall of the second flow passage member is formed of a porous sintered metal material.

5. A gas/liquid interface structure according to claim 1, wherein the porous cylindrical wall comprises porosity with an average pore size in the range of from about 0.5 to about 30 microns.

6. A gas/liquid interface structure according to claim 1, wherein the first and second flow passage members are each cylindrical in character and coaxial with one another.

7. A gas/liquid interface structure according to claim 1, wherein the liquid reservoir jacket enclosingly circumscribing the second flow passage member comprises a cylindrical side wall in radially spaced relationship to the second flow passage member, a top end wall through which the first liquid flow passage member extends, and a bottom end wall between the second flow passage member and the cylindrical side wall.

8. A gas/liquid interface structure according to claim 1, wherein the means for introducing pressurized liquid into the enclosed interior annular volume of the liquid reservoir jacket is constructed and arranged for tangential feeding of the pressurized liquid into the enclosed interior annular volume, for circumferential distribution of the introduced liquid around the upper liquid-permeable wall of the second flow passage member.

9. A gas/liquid interface structure according to claim 1, constructed and arranged so that the weir liquid rate is decoupled from levelness of the structure.

10. A gas/liquid interface structure according to claim 1, constructed and arranged so that the weir liquid rate is decoupled from minimum wetting rate.

11. A gas/liquid interface structure for transport of a gas stream from an upstream source of same to a downstream processing unit, comprising first and second flow passage members defining an annular volume therebetween, with the second flow passage member extending downwardly to a lower elevation than the lower end of the first flow passage member, with a liquid reservoir jacket enclosingly circumscribing the second flow passage member and defining therewith an enclosed interior annular volume, and means for introducing pressurized liquid into the enclosed interior annular volume, wherein the second flow passage member includes an upper liquid-permeable wall, and a lower liquid-impermeable wall extending downwardly from the upper liquid-permeable wall, with the upper liquid-permeable wall terminating at a lower end that is joined to an upper end of the lower liquid-impermeable wall, wherein the upper liquid-permeable wall is (i) in liquid flow communication with the enclosed interior annular volume of the liquid reservoir jacket, (ii) formed of a liquid-permeable material and (iii) permeable to flow of the pressurized liquid therethrough over its entire surface, whereby pressurized liquid in the enclosed interior annular volume of the liquid reservoir jacket can weep through the liquid-permeable wall to coalesce on an inner surface thereof and form a falling liquid film for downward flow on an interior surface of the lower liquid-impermeable wall of the second flow passage member, as a protective liquid interface for the second flow passage member so that the gas stream does not contact the interior surface of the lower liquid-impermeable wall, wherein the first flow passage member terminates at a lower end which is below the elevation of the juncture of the upper liquid-permeable wall and lower liquid-impermeable wall of the second flow passage member, and wherein the liquid reservoir jacket enclosingly circumscribes substantially only the upper liquid-permeable wall and not the lower liquid-impermeable wall of the second flow passage member.

12. A gas/liquid interface structure according to claim 11, wherein the upper liquid-permeable wall of the second flow passage member is cylindrical.

13. A gas/liquid interface structure according to claim 12, wherein the porous cylindrical wall member is formed of a material selected from the group consisting of sintered metal materials, porous ceramic materials, and porous plastic materials.

14. A gas/liquid interface structure according to claim 11, wherein the upper liquid-permeable wall of the second flow passage member is formed of a porous sintered metal material.

15. A gas/liquid interface structure according to claim 11, wherein the upper liquid-permeable wall comprises porosity with an average pore size in the range of from about 0.5 to about 30 microns.

16. A gas/liquid interface structure according to claim 11, wherein the first and second flow passage members are each cylindrical in character and coaxial with one another.

17. A gas/liquid interface structure according to claim 11, wherein the liquid reservoir jacket enclosingly circumscribing the second flow passage member comprises a cylindrical side wall in radially spaced relationship to the second flow passage member, a top end wall through which the first liquid flow passage member extends, and a bottom end wall between the second flow passage member and the cylindrical side wall.

18. A gas/liquid interface structure according to claim 11, wherein the means for introducing pressurized liquid into the enclosed interior annular volume is constructed and arranged for tangential feeding of the pressurized liquid into the enclosed interior annular volume, for circumferential distribution of the introduced liquid around the upper liquid-permeable wall of the second flow passage member.

19. A gas/liquid interface structure according to claim 11, constructed and arranged so that the weir liquid rate is decoupled from levelness of the structure and minimum wetting rate.

* * * * *

UNITED STATES PATENT AND TRADEMARK OFFICE
CERTIFICATE OF CORRECTION

PATENT NO.    : 5,833,888
DATED         : November 10, 1998
INVENTOR(S)   : Arya et al.

It is certified that error appears in the above-indentified patent and that said Letters Patent is hereby corrected as shown below:

Column 5, line 49   "micro-electromachining, electromachining, or"
                    Should be --micro-electromachining, or--

Signed and Sealed this

Twentieth Day of April, 1999

Q. TODD DICKINSON

Attest:

Attesting Officer

Acting Commissioner of Patents and Trademarks